(12) United States Patent
Nohara et al.

(10) Patent No.: US 6,921,328 B1
(45) Date of Patent: Jul. 26, 2005

(54) COOLING DEVICE FOR ELECTRIC EQUIPMENT

(75) Inventors: Shuhei Nohara, Kitakyushu (JP); Hiromi Imamura, Kitakyushu (JP); Masayuki Ono, Kitakyushu (JP); Kenji Isomoto, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 09/700,957

(22) PCT Filed: May 24, 1999

(86) PCT No.: PCT/JP99/02704

§ 371 (c)(1),
(2), (4) Date: Jan. 22, 2001

(87) PCT Pub. No.: WO99/62311

PCT Pub. Date: Dec. 2, 1999

(30) Foreign Application Priority Data

May 26, 1998 (JP) .................................. 10-163001

(51) Int. Cl.[7] ............................. H05K 7/20; F01D 25/24
(52) U.S. Cl. ..................... 454/184; 165/80.3; 361/695; 415/213.1; 416/274 R
(58) Field of Search ................................ 165/121–122, 165/80.3, 185; 361/695, 697; 415/121.2, 415/213.1, 214.1, 175–178; 416/247 R; 454/184

(56) References Cited

U.S. PATENT DOCUMENTS

| | | | |
|---|---|---|---|
| 2,653,757 A | * | 9/1953 | Segalman ............... 416/247 R |
| 4,834,615 A | * | 5/1989 | Mauch et al. ............ 415/213.1 |
| 5,101,321 A | * | 3/1992 | Remise et al. ............... 361/695 |
| 5,335,722 A | * | 8/1994 | Wu .............................. 165/122 |
| 5,713,790 A | * | 2/1998 | Lin ............................. 454/184 |
| 5,927,386 A | * | 7/1999 | Lin ............................ 165/80.3 |
| 6,024,536 A | * | 2/2000 | Tsubakida et al. .......... 416/189 |
| 6,031,719 A | * | 2/2000 | Schmitt et al. ............. 361/695 |
| 6,074,296 A | * | 6/2000 | Wu .............................. 454/184 |
| 6,109,340 A | * | 8/2000 | Nakase et al. ............. 165/80.3 |
| 6,109,341 A | * | 8/2000 | Kodaira et al. ............ 165/80.3 |
| 6,109,864 A | * | 8/2000 | Schofield et al. ............. 415/90 |
| 6,190,135 B1 | * | 2/2001 | Winkler .................. 416/247 R |

* cited by examiner

*Primary Examiner*—Leonard R. Leo
(74) *Attorney, Agent, or Firm*—Jordan and Hamburg LLP

(57) ABSTRACT

A cooling device for an electric equipment which is excellent in cooling efficiency and low in noise and permits easy mounting of a cooling fan and a fan guard, comprising a heat sink (1) having a U-shaped frame (4) consisting of a flat part (2) and side parts (3) disposed on the opposite sides of the flat part (2), fins (5) formed on the frame (4) and fan guard mounting holes (6) formed in the side parts (3) of the frame (4); a cooling fan (7) having an engaging recess (8) in the side thereof; and a U-shaped fan guard (9) consisting of a fan guard body (10) and side plates (11) disposed on the opposite ends of the fan guard body (10); wherein a lattice body (12) is provided on the fan guard body (10), an air guide (17) at the tip end of each side plate (11), a fan mounting engaging projection (13) on the inner side surface of each side plate for clamping and retaining by engaging the cooling fan (7) and a projection support (15), having an engaging projection (14) for mounting the fan guard (9) to the heat sink (1), on the outer side surface of each side plate.

2 Claims, 4 Drawing Sheets

PRIOR ART

COOLING DEVICE FOR ELECTRIC EQUIPMENT

TECHNICAL FIELD

The present invention relates to a cooling apparatus for electrical equipment employed in, for example, control units such as inverters.

BACKGROUND ART

FIGS. 3 and 4 show a typical conventional cooling apparatus for electrical equipment.

In these drawings, the reference number 21 indicates a heat sink of a control unit (not shown) such as an inverter. The heat sink 21 comprises a gate-shaped frame 24 having a flat section 22, with side sections 23 located respectively on both sides of the flat section 22, and fins 25. The frame 24 of the heat sink 21 is equipped with an electronic device (not shown) and thermally connected to a heating member. A cooling fan 26 is to be mounted to the frame 24 of the heat sink 21, and a fan guard 27 is to be mounted to the cooling fan 26 so as to cover the front face of the cooling fan 26 with a grille section 28 of the fan guard 27. The cooling fan 26 and fan guard 27 are formed with through holes 29 and 30 provided in corresponding positions, respectively. A long clamping screw 31 is respectively put through these through holes 29 and 30, and then screwed into a corresponding threaded hole (not shown) formed in the frame 24 of the heat sink 21 to fasten the cooling fan 26 and fan guard 27 to the heat sink 21.

The above-mentioned construction is cooled by the following manner.

A cooling airflow generated by driving the cooling fan 26 is directed into the interior of the frame of the heat sink 21. The cooling air is passed between fins 25 of the heat sink 21 and discharged to outside of the control unit and others. When the cooling air is passed between fins 25, heat exchange is performed between the fins 25 and the cooling air so that the heat sink 21, absorbing heat from the electronic device and others (not shown) drops in temperature. Thus, the electrical equipment including the control unit is cooled.

However, in the conventional cooling apparatus for electrical equipment, the following problems have been recognized.

(1) Inefficiency in utilizing the cooling air due to the circumvention of the cooling air through a side space of the cooling fan 26.

As shown in FIG. 4(a), when the cooling airflow generated by the cooling fan 26 flows between the fins 25 of the heat sink 21, a part of the cooling air comes in conflict with the front end of the fins 25 of the heat sink 21 so that a turbulence is caused in the cooling airflow.

In addition, between the cooling fan 26 and the heat sink 21, there exists a gap formed over the entire surface of the cooling fan 26 in its width direction at approximately the same position in the longitudinal direction of the cooling fan 26. Thus, the turbulent cooling air yields a kinetic energy in the width direction on the cooling fan 26, and can easily escape from the gap between the cooling fan 26 and the fins 25 through a side space of the cooling fan 26. Then, as shown by the arrow in FIG. 4(a), the cooling air escaping from the gap is turned over to an inlet port of the cooling fan 26, which results in inefficiency in utilizing the cooling air.

(2) Inefficiency in cooling due to high air resistance in the grille section 28 of the fan guard 27. Undesirable wind noise occurs in the grille section 28.

As shown in FIG. 4(b), the generated cooling airflow is directed on a tilt in the rotation direction of the cooling fan 26 with respect to a rotation axis of the cooling fan 26. Thus, when the cooling air is sucked toward the cooling fan 26, the cooling air obliquely passes through the grille section 28 of the fan guard 27 so that the air resistance of the grille section 28 is increased and the substantial airflow area of the grille section 28 is decreased, resulting in lowered efficiency in cooling. Further, each corner of the grille section 28 protrudes into the path of the cooling air so that the corner creates air turbulence to cause undesirable wind noise.

(3) Low efficiency and difficult assembly due to the fastening structure in which the cooling fan 26 and the fan guard 27 are commonly clamped to the heat sink 21 by the clamping screw 31.

As shown in FIG. 3, the cooling fan 26 and the fan guard 27 are commonly clamped and fastened to the heat sink 21 by the long clamping screw 31. Thus, the positioning of individual parts and the clamping of the clamping screw 31 are required to simultaneously operate, resulting in low efficiency and difficult assembly.

As a result, the effort required for periodical maintenance check and replacements for the cooling fan 26 inevitably deteriorates operational efficiency.

DISCLOSURE OF INVENTION

It is an object of the present invention to provide a cooling apparatus for electrical equipment, which has excellent cooling efficiency and low noise and is easily assembled with a cooling fan and a fan guard.

In order to solve the aforementioned problems, a cooling apparatus for electrical equipment according to the present invention, comprising: a heat sink including a gate-shaped frame having a flat section and side sections located respectively on both sides of the flat section, fins formed on the frame, and a fan guard mounting hole formed in the side section of the frame; a cooling fan having an engaging groove in each of side sections of the cooling fan; and a gate-shaped fan guard including a fan guard body and side plates located respectively on both sides of the fan guard body, wherein the fan guard body includes a grille section, the side plates including a shroud section at the rear end portion of each side plate, the side plates being provided with a fan mounting/engaging protrusion for pressingly clamping and engagingly retaining the cooling fan, on the inner surface of the side plate, the side plates including a protrusion supporting section having an engaging protrusion for mounting the fan guard to the heat sink, on the outer surface of each side plate.

Thus, cooling air is guided to the heat sink by the shrouded section of the fan guard to create a smooth cooling airflow, so that cooling efficiency can be enhanced. Further, the fan and the fan guard as well as the fan guard and the heat sink can be fastened to each other by the engaging portions provided in the fan guard in a snap-in manner, so that the cooling fan and the fan guard can be easily assembled, or mounted to, and disassembled, or demounted from the heat sink.

According to other aspects of the present invention, there are provided the following effects.

(1) The fan guard is provided with a side plate including the shroud section. The shroud section may be adapted to extend beyond the cooling fan and lie on a more inward side of the heat sink than the position of the front end of the fins of the heat sink, so that circumvention of the cooling air can be prevented. Thus, the cooling airflow generated by the cooling fan is fully and smoothly guided toward the heat sink so that cooling efficiency can be significantly improved.

(2) The fan guard is provided with a side plate including the protrusion supporting portion. The side plate and the protrusion supporting portion may be adapted to be sufficient long so as to yield resiliency to the engaging protrusion provided in the protrusion supporting portion, so that the protrusion supporting portion can be deflected with a small force and the engaging protrusion can be easily operated for mounting and demounting. Thus, the fan guard can be quite easily mounted to and demounted from the heat sink.

(3) Each side surface of the grille section of the fan guard, which is arranged in the circumferential direction of the grille section, may be slanted along the direction of the cooling airflow so that the air resistance or aerodynamic drag of the grille section can be reduced and the substantial airflow area of the grille section can also be increased, which results in enhanced cooling efficiency. Further, any portions protruding toward the cooling airflow can be eliminated so that no turbulence is generated and wind noise can thereby be reduced.

BRIEF DESCRIPTION OF DRAWINGS

FIG. 2 shows the cooling apparatus for electrical equipment according to the embodiment of the present invention, in which

FIG. 4 shows the conventional cooling apparatus for electrical equipment, in which

BEST MODE FOR CARRYING OUT THE INVENTION

Figure 1:
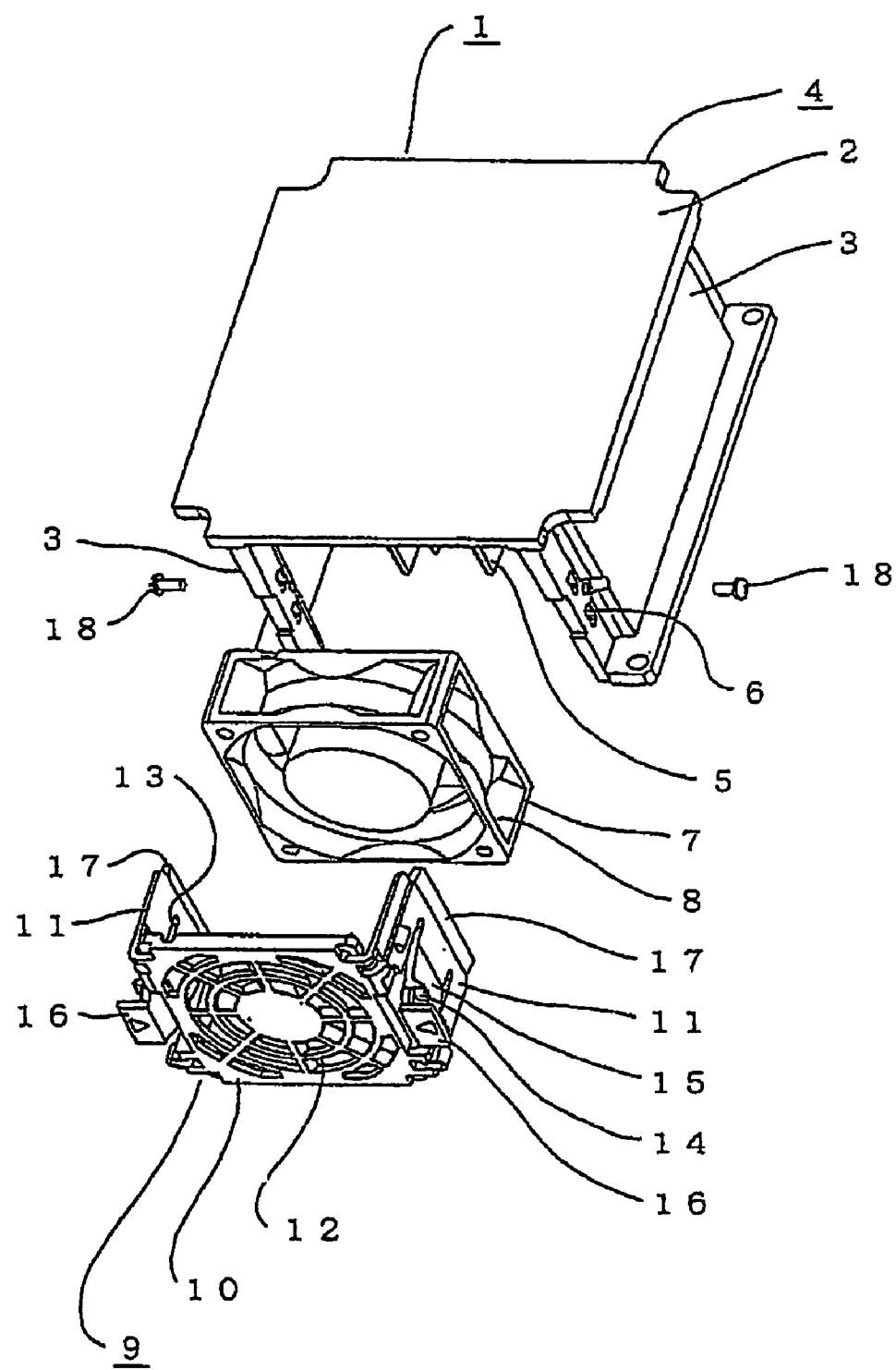
FIG. 1 is an exploded perspective view showing a cooling apparatus for electrical equipment according to an embodiment of the present invention.

With reference to FIGS. 1 and 2, an embodiment of the present invention will now be described.

Figure 2A:
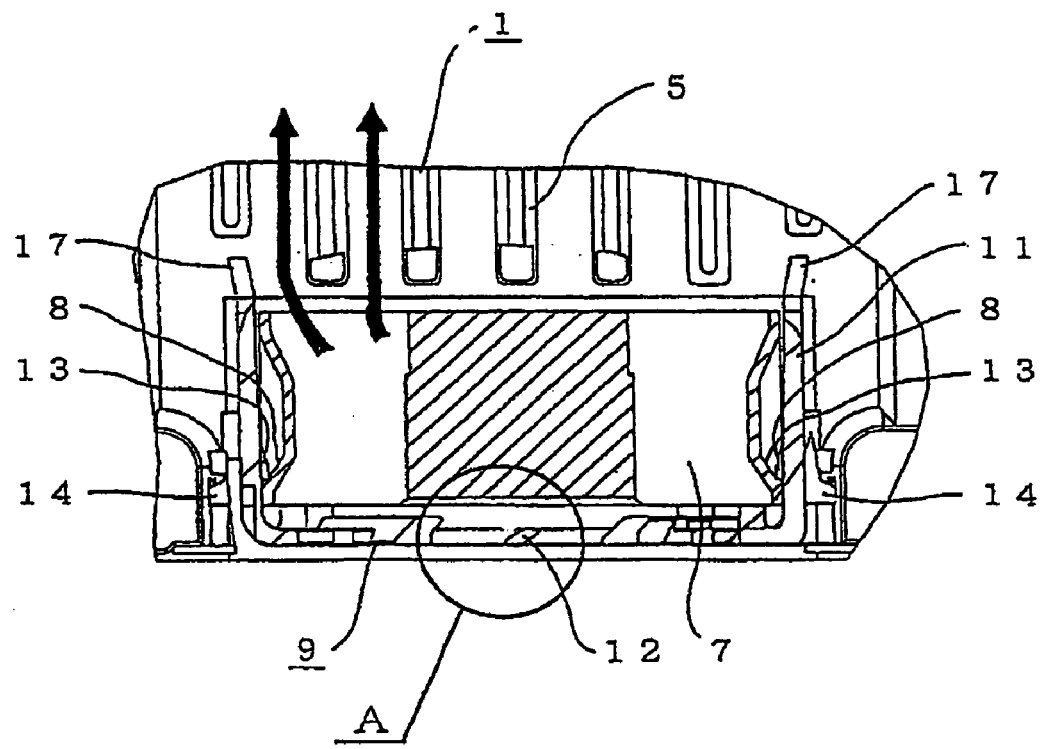
FIG. 2(a) is a horizontal cross-sectional view of the substantial part thereof.
Figure 2B:
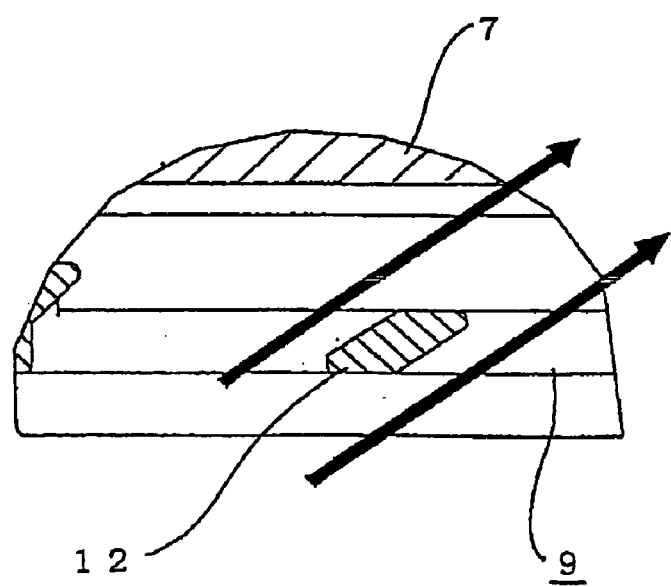
FIG. 2(b) is an enlarged view of the region A shown in FIG. 2(a)
Figure 3:
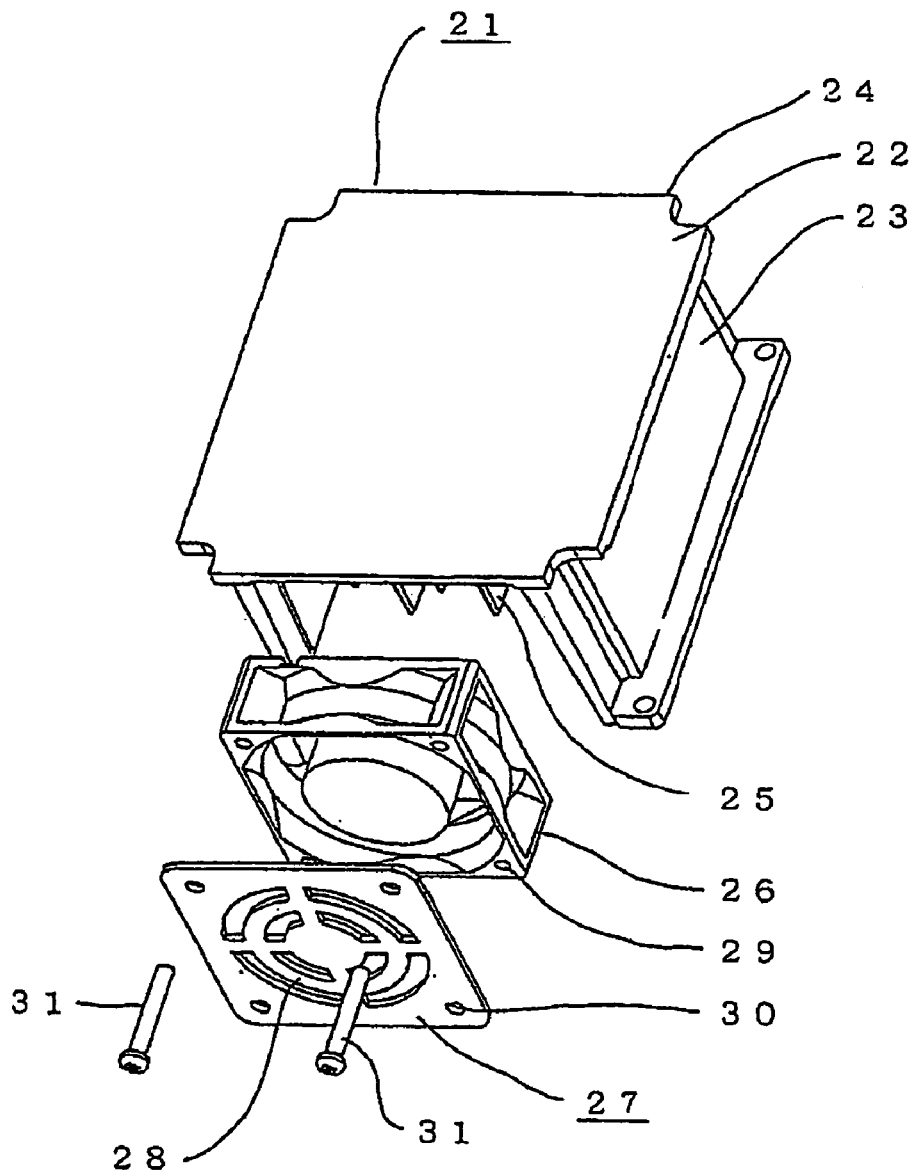
FIG. 3 is an exploded perspective view showing a conventional cooling apparatus for electrical equipment.
Figure 4A:
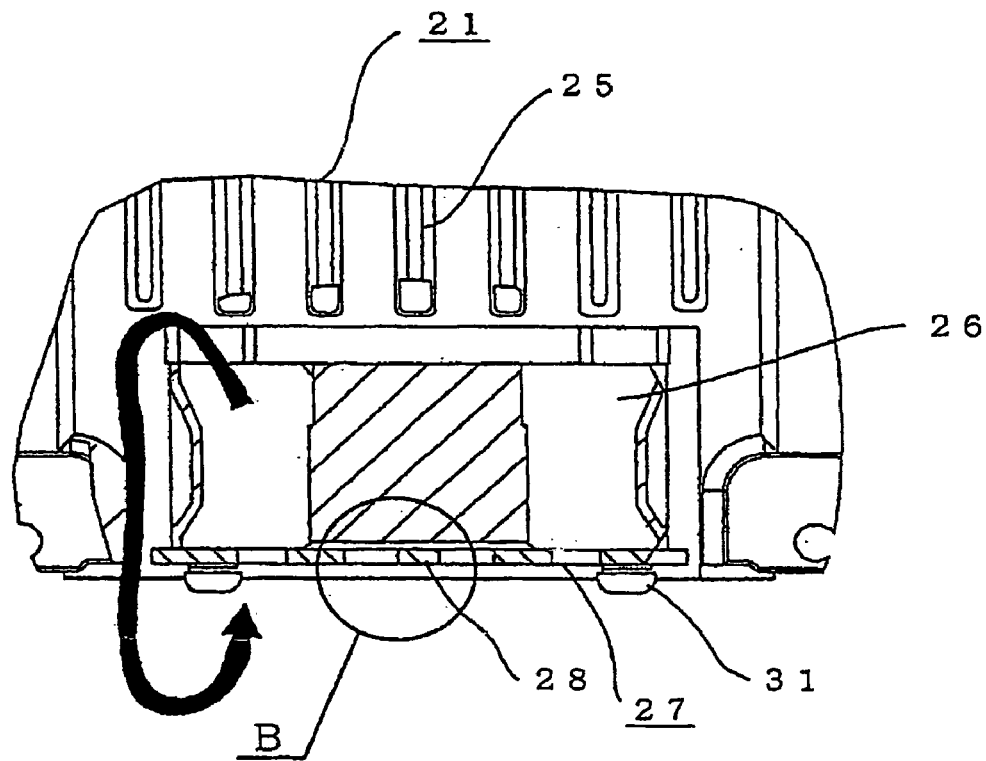
FIG. 4(a) is a horizontal cross-sectional view of the substantial part thereof.
Figure 4B:
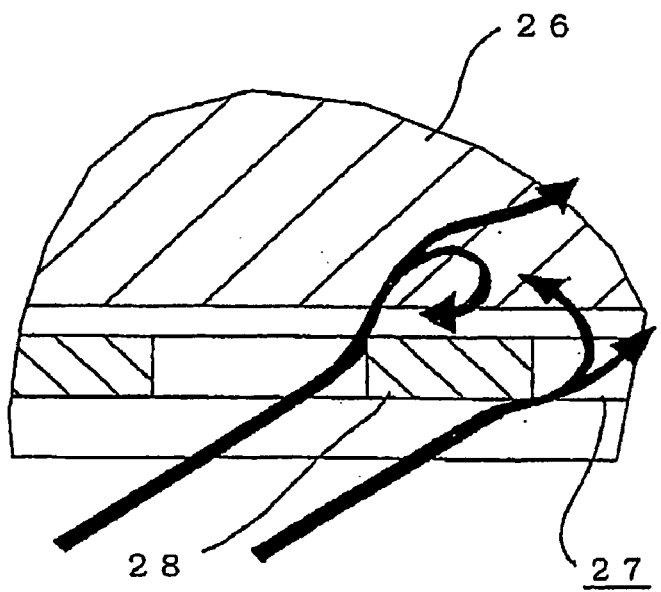
FIG. 4(b) is an enlarged view of the region B shown in FIG. 4(a).

FIG. 1 is an exploded perspective view showing a cooling apparatus for electrical equipment according to an embodiment of the present invention. FIG. 2 shows the cooling apparatus for electrical equipment according to the embodiment of the present invention, in which FIG. 2(a) is a horizontal cross-sectional view of the substantial part thereof, and FIG. 2(b) is an enlarged view of the region A shown in FIG. 2(a).

In these drawings, the reference number 1 indicates a heat sink of a control unit (not shown) such as an inverter. The heat sink 1 comprises a gate-shaped frame 4 having a flat section 2, side sections 3 located respectively on both sides of the flat section 2, and fins 5. A fan guard mounting hole 6 is formed respectively in both side sections 3. The frame 4 of the heat sink 1 is equipped with an electronic device (not shown) and thermally connected to a heating member. A cooling fan 7 is to be mounted to the frame 4 of the heat sink 1 and has an engaging groove 8 in each of the side sections of the cooling fan 7. A fan guard 9 is to be mounted to the cooling fan 7 so as to cover the front face of the cooling fan 7. The fan guard 9 comprises a fan guard body 10 and side plates 11 located respectively on both sides of the fan guard body 10, and the fan guard 9 has a gate-like shape. The fan guard body 10 is formed with a grille section 12 for allowing cooling air to pass therethrough. The inner surface of each side plate 11 is provided with a fan mounting/engaging protrusion 13 for pressingly clamping and engagingly retaining the cooling fan 7. The outer surface of each side plate 11 is also provided with a protrusion supporting section 15 having an engaging protrusion 14 for mounting the fan guard 9 to the heat sink 1. The protrusion supporting section 15 has resiliency or flexibility, and includes a tab 16 for releasing the engagement between the fan guard 9 and the heat sink 1, at the front end of the protrusion supporting section 15. The side plates 11 include a shroud section 17 at their rear end portion. When the cooling fan 7 has been assembled or mounted to the fan guard 9, the shroud section 17 has a longer length than that of the cooling fan 7. The number 18 indicates respective mounting screws.

In the cooling apparatus having the above construction, the cooling fan 7 and the fan guard 9 are assembled to the heat sink 1 in the following manner.

Firstly, the cooling fan 7 is fitted between the side plates 11 by expanding both side plates of the fan guard 9 outward, and the cooling fan 7 is then mounted to the fan guard 9 by engaging each the fan mounting/engaging protrusions 13 of the side plates 11 with the corresponding engaging groove 8 of the cooling fan 7 in a snap-in manner.

Then, the fan guard 9 mounted to the cooling fan 7 is further mounted to the heat sink 1 in the same snap-in manner. This is achieved by inserting the side plates 11 of the fan guard 9 between both side sections 3 of the heat sink 1 and by engaging each engaging protrusion 14 of the side plates 11 with the corresponding fan guard mounting hole 6 formed in the side sections 3 of the heat sink 1.

For maintenance and replacement, the cooling fan 7 is disassembled from the heat sink 1 in the following manner.

First, each tab 16 is pushed inward to deflect the protrusion supporting section 15 inward. This allows each engaging protrusion 14 to be moved inward and be separated from the corresponding fan guard mounting hole 6. Thus, the fan guard 9 is demounted from the heat sink 1, still mounted to the cooling fan 7.

Then, the side sections of the fan guard 3 are respectively opened outward to move the fan mounting/engaging protrusions 13 outward, so that the engagement between each fan mounting/engaging protrusion 13 and the corresponding engaging groove 8 of the cooling fan 7 is released. This allows the cooling fan 7 to be demounted from the fan guard 9.

A cooling apparatus having the above construction achieves its cooling function in the following manner.

A cooling airflow is generated by driving the cooling fan 7, and the cooling air flows inside the frame 4 of the heat sink 1. During this process, the shroud section 17 is adapted to extend beyond the cooling fan 7 and lie on a more inward side of the heat sink 1 than the position of the front end of the fins 5 of the heat sink 1, so that a gap between the cooling fan 7 and the fins 5 of the heat sink 1 is not formed over the entire surface of the cooling fan 7 in its width direction at the approximately same position in the longitudinal direction of the cooling fan 7. If some turbulence occurs in the gap, the cooling air is guided by the shroud sections 17 to flow between fins 5. Thus, the cooling airflow generated by the cooling fan 7 would never be turned over to the inlet side of the cooling fan 7.

The cooling air is introduced from the front end of the heat sink 1, efficiently passed in between fins 5 of the heat sink 1 without any leakage to outside, and eventually discharged to outside of the control unit and elsewhere. When the cooling air is passed between the fins 5, heat exchange is performed between the fins 5 and the cooling air so that the heat sink 1 absorbing the heat of the electronic device and others (not shown) is reduced in temperature. Thus, the electrical device including the control unit is cooled.

As shown in FIG. 2(b), each side surface of the grille section 12 of the fan guard 9, which is arranged in the circumferential direction of the grille section 12, is slanted along the direction of the cooling airflow so that the air resistance or aerodynamic drag of the grille section 12 can be reduced and the substantial airflow area of the grille section 12 can also be increased, which results in enhanced cooling efficiency. Further, any portions protruding into the cooling airflow can be eliminated so that no turbulence is generated and wind noise can thereby be reduced.

As to mounting and demounting the fan guard 9 to/from the heat sink 1, the fan guard 9 is provided with side plates 11, and the protrusion supporting portion 15 having a sufficient length is formed respectively in side plates 11. Thus, an adequate resiliency or flexibility can be easily given to the engaging protrusion 14 provided in the protrusion supporting portion 15 so that the protrusion supporting portion 15 can be deflected with a small force and the engaging protrusion 14 can be easily mounted and demounted. Thus, the fan guard 9 can be quite easily mounted to and demounted from the heat sink 1.

In addition, the tab 16 of the protrusion supporting section 15 is located at the front face of the fan guard 9 so that it can be easily determined whether the engaging protrusion 14 is securely engaged by checking out the position of the tab 16 (If the protrusion 14 is not securely engaged, the corresponding tab 16 lies inward.

Furthermore, as needed, when the cooling fan 7 and the fan guard 9 are mounted to the heat sink 1, the screws 18 can screw into threaded holes (not shown) provided in the fan guard 9 to prevent the cooling fan 7 and the fan guard 9 from falling out, which results in improved safety.

INDUSTRIAL APPLICABILITY

The present invention may apply to a cooling apparatus for electrical equipment, and can be utilized in fields of manufacturing by providing a cooling apparatus for electrical equipment which has excellent cooling efficiency and low noise, and which can be easily assembled with a cooling fan and fan guard.

What is claimed is:
1. A cooling apparatus for electrical equipment, comprising:
   a heat sink including a gate-shaped frame having a flat section and side sections located respectively on both sides of said flat section, fins formed on said frame, and a fan guard mounting hole formed in said side section of said frame;
   a cooling fan having an engaging groove in each side section of said cooling fan; and
   a gate-shaped fan guard including a fan guard body and side plates located respectively on both sides of said fan guard body, wherein said fan guard body includes a grille section, said side plates including a shroud section at the rear end portion of each side plate, said side plates being provided with a fan mounting/engaging protrusion for clamping and engaging said cooling fan, on the inner surface of said side plate, said side plates including a protrusion supporting section having an engaging protrusion for mounting said fan guard to said heat sink, in the outer surface of said side plate.
2. A cooling apparatus for electrical equipment as defined in claim 1, wherein said grille section of said fan guard includes a side surface arranged in the circumferential direction of said grille section, wherein said side surface is slanted along the direction of a cooling airflow.

* * * * *